United States Patent [19]

Zwanziger

[11] Patent Number: 4,987,362
[45] Date of Patent: Jan. 22, 1991

[54] SELF-REGULATING DRIVE CIRCUIT FOR THE BASE CURRENT OF A POWER TRANSISTOR WITH SATURATION LEVEL CONTROL

[75] Inventor: Peter Zwanziger, Nuremberg, Fed. Rep. of Germany

[73] Assignee: Siemens Aktiengesellschaft, Berlin & Munich, Fed. Rep. of Germany

[21] Appl. No.: 444,037

[22] Filed: Nov. 30, 1989

[30] Foreign Application Priority Data

Dec. 13, 1988 [EP] European Pat. Off. ........ 88120832.6

[51] Int. Cl.⁵ .............................................. G05F 1/56
[52] U.S. Cl. ..................................... 323/289; 307/270
[58] Field of Search ..................... 323/282, 285, 289; 307/270, 280, 300

[56] References Cited

U.S. PATENT DOCUMENTS

| | | | |
|---|---|---|---|
| 4,564,769 | 1/1986 | Melamed | 323/289 |
| 4,588,904 | 5/1986 | Glogolja | 307/270 |
| 4,684,879 | 8/1987 | Bredenkamp | 323/289 |
| 4,716,513 | 12/1987 | Ito | 323/289 |
| 4,755,741 | 5/1988 | Nelson | 323/289 |
| 4,864,214 | 9/1989 | Billings et al. | 323/289 |

FOREIGN PATENT DOCUMENTS 3215009 12/1983 Fed. Rep. of Germany .

OTHER PUBLICATIONS

Publication ELEKTRIE, Berlin 39 (1985) 5, p. 180.
"VI. Treiberstufen fuer schnelle Schalttransistoren", by Klaus Rischmueller, from the handbook Schalt-Transistoren, of Thomson-CSF, 1979, pp. 115-137.

Primary Examiner—Peter S. Wong
Attorney, Agent, or Firm—Kenyon & Kenyon

[57] ABSTRACT

An arrangement for controlling the base current of a power transistor comprising an adjustable driver stage which provides the drive power for switching on the power transistor at its base lead. A coupling diode is provided which taps off the voltage at the output of the power transistor. A saturation level control operates in parallel to the adjustable driver stage. A control current is supplied through a coupling diode when the voltage at the output of the power transistor signifies a system variable. The control current forms an auxiliary manipulated variable which adjusts the driver's output so as to supply the power transistor with exactly the right amount of drive power. The power transistor is thereby operated with the desired level of saturation, and particularly at the edge of saturation.

8 Claims, 2 Drawing Sheets

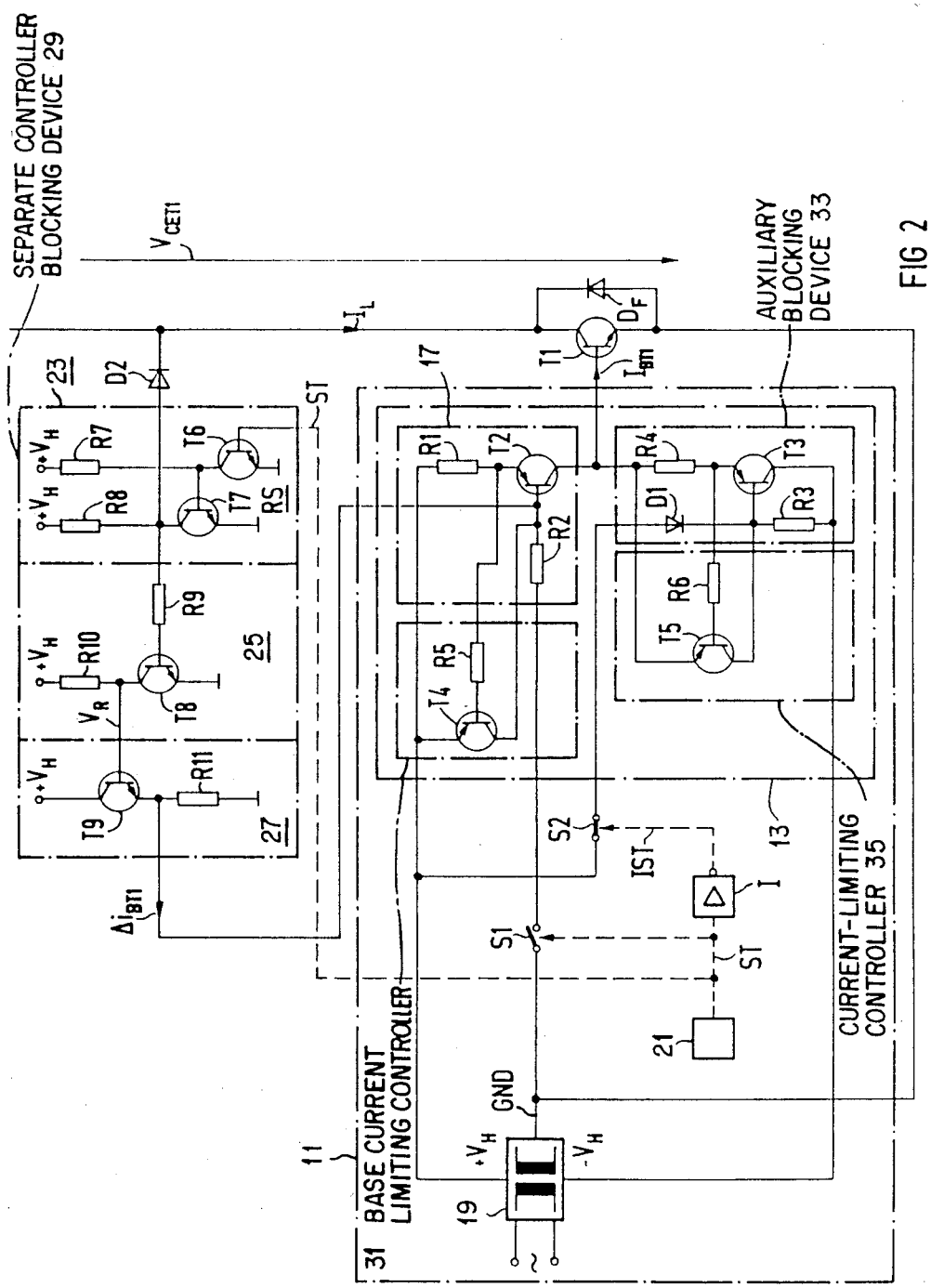

SELF-REGULATING DRIVE CIRCUIT FOR THE BASE CURRENT OF A POWER TRANSISTOR WITH SATURATION LEVEL CONTROL

FIELD OF THE INVENTION

The present invention relates to devices for controlling a power transistor and more particularly to a drive circuit controlling the base current of a power transistor.

BACKGROUND OF THE INVENTION

When a power transistor is in the current-conducting lo state, drive circuits are needed to provide a level of base current Which ensures that current conduction is present in the transistor no matter its operating condition. Also, there is a need to keep the forward power losses to a minimum. This is generally achieved by providing a substantial base current that puts the transistor in a state of full or over saturation.

However, when operating a power transistor in this manner, the amount of expended drive power is quite substantial. When the edge of saturation of the transistor is reached, additional increases in the base current do not result in an improvement of the conducting state nor in a reduction of the transistor on-state voltage. Rather, these increases in the base current only cause the drive-power to be increased. In addition, non-conducting power transistors are powered up unnecessarily when operated in this manner in pwm-controlled converter circuits. If counter-electro magnetic forces result, as in the case of an inductive load driven by a pwm-controlled ac converter, at least one of the power transistors could pass over into the undesirable, inverse direction of operation. This transistor could be destroyed during current commutation operations due to sudden, steep changes in the output voltage. ("dV/dt-loading")

Operating a power transistor in the over or full saturation condition leads to considerable problems when the transistor is switched off. In order for the load current to be able to dissipate through the transistor after it has begun to switch off, all charge carriers must first be withdrawn from the base region and the base-emitter junction must be blocked. The amount of time this takes is a dead time called storage time. The deeper into saturation the transistor was before the transistor is forced to switch off, the longer is the storage time. The duration of this storage time influences the losses which occur during the switching-off operation. For this reason, self-regulating drive circuits are designed so that when the power transistor is switched on, the operating point is as close to the edge of saturation as possible. In other words, the operating point is in the area of quasi-saturation.

In this connection, a self-regulating driver stage is shown in the publication ELEKTRIE, Berlin 39 (1985) 5, page 180, illustration 7. Here, an anti-saturation diode is used to avoid full or super saturation. In this method, the voltage on the output of the transistor is limited to the sum of the voltage on the base-emitter junction and the conducting-state voltage of the anti-saturation diode. In the final control element of the transistor, excess base currents which are not needed to reach the edge of saturation can be dissipated into the collector-emitter junction of the transistor. A disadvantage with this type of circuit is that excessive control losses occur constantly. In addition, the anti-saturation diode must be designed to conduct any possible high currents.

Another self-regulating driver stage is shown in FIG. 3 of the German Published Patent Application No. 32 15 009. Here, a series connection comprising a high-speed circuit breaker and a current regulator is arranged between an auxiliary power source and the base of the driven power transistor. The current regulator contains a power transistor whose base is coupled through an anti-saturation diode to the output of the s driven power transistor. There are disadvantages when using these self-regulating driver stages, because they depend directly on the load current in the driven power transistor. The base-current closed loop is unstable due to the unavoidable line inductances, the base-emitter capacitance, and the conducted interferences in the drive power transistor. A powerful harmonic oscillation occurs constantly in the base current. These types of oscillations can be reduced by placing a damping resistor at the base lead of the power transistor, but the damping resistor diminishes the effectiveness of the anti-saturation diode.

Another drive circuit is described in U.S. Pat. No. 4,755,741. This drive circuit is connected to the driven transistor at its base lead through a second emitter lead. The transistor is driven by a final control element that is connected in series with a constant current source and another, variable current source that is controlled by the magnitude of the load current. This variable current source operates independently of the actual magnitude of the load current, and results in an operating point in the saturation or over saturation range. An operating point at the edge of saturation is possible because the excess portion of the drive power is dissipated from the base of the driven transistor through a second emitter electrode. A disadvantage of this type of arrangement is that when the power balance of the circuit worsens, an excess current is continuously fed into the base of the driven transistor. This excess current is fed back into the drive circuit through a short-circuit with a second emitter electrode being used for overflow storage. This method of removing excess current is also known as a desaturation bypass. It is not possible to adjust the operating point, especially at or around the edge of saturation, since the dissipation of excess base current depends on the external and internal design of the driven transistor.

Thus there is a need for a device to control the operating point in a power transistor that is retrofittable to already existing drive circuits and avoids the above-mentioned disadvantages associated with the known circuits.

SUMMARY OF THE INVENTION

These and other needs are satisfied by the arrangement of the present invention to control the base current of a power transistor. This arrangement comprises an adjustable driver stage, a coupling diode, and a saturation level control. The saturation level control works in parallel with the adjustable driver stage and forms an auxiliary manipulated variable which adjusts the driver stage so as to supply the power transistor with exactly the right amount of drive power to operate the power transistor with the desired level of saturation, and particularly at the edge of saturation. In addition, a controller blocking device is provided for the saturation control which stops the operation of the saturation level control when a fault occurs.

BRIEF DESCRIPTION OF THE DRAWINGS

FIG. 2 is a detailed diagram of the arrangement of FIG. 1.

DETAILED DESCRIPTION

Figure 1:
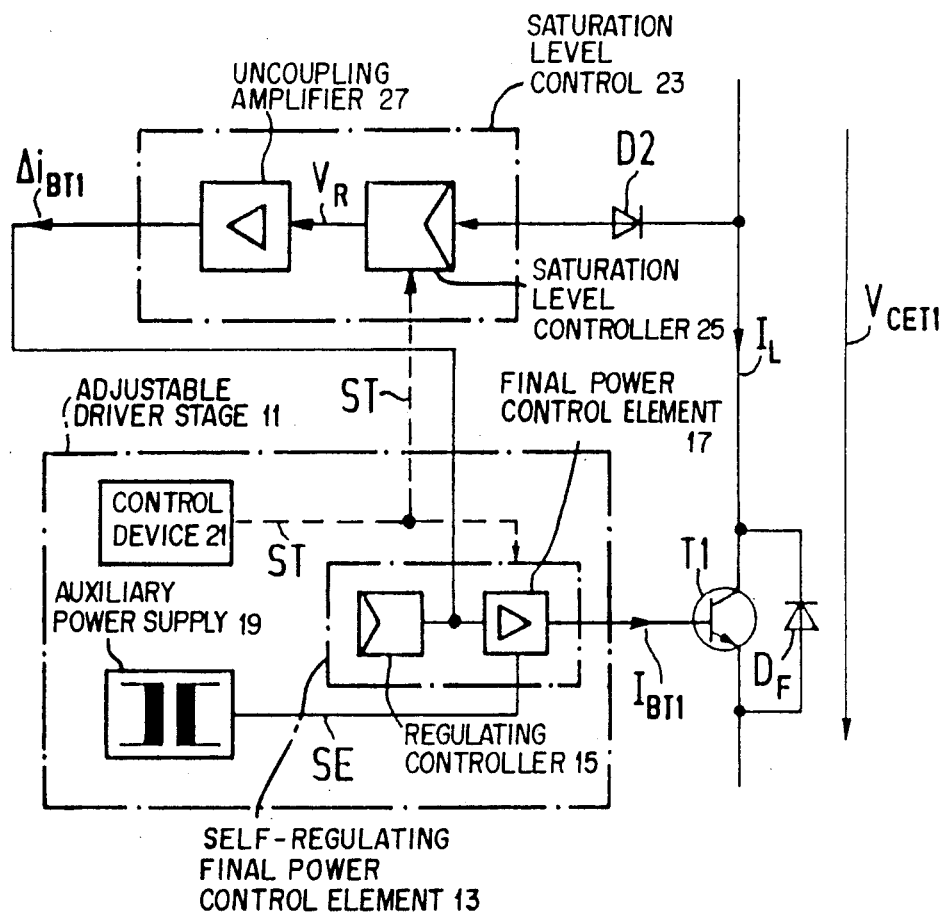
FIG. 1 is a block diagram of an embodiment according to the present invention.

Referring to FIG. 1, base current $I_{BT1}$ having an appropriate polarity is supplied to a power transistor T1 by a controllable and adjustable driver stage 11. The power required for driving the power transistor T1 is provided by a self-regulating final power control element 13 comprising a regulating controller 15 coupled to a final power control element 17. The regulating power SE is supplied to the final power control element 17 by an auxiliary power supply 19. The self-regulating final power control element 13 is switched over by a control device 21 and its emitted control signal ST to control the base current $I_{BT1}$ so that it has the correct polarity to switch the power transistor T1 on or off.

In accordance with the invention, the on-state voltage $V_{CET1}$ of the power transistor T1 is supplied as a system deviation through a high-blocking, high-speed coupling diode D2 of a saturation level control 23. The saturation level control 23 contains a saturation level controller 25 that forms the control manipulated $\Delta i_{BT1}$. This control manipulated variable $\Delta i_{BT1}$ adjusts the desired level of saturation of the power transistor T1 at the driver stage 11. The saturation level controller 25 preferably has a proportional response characteristic and is therefore known as a P-controller.

In the embodiment of the invention illustrated in FIG. 1, the saturation level controller 25 acts on the driver stage 11 through an additional uncoupling amplifier 27 with a high-resistance input and a low-resistance output. The use of the uncoupling amplifier 27 further stabilizes the control of the base current $I_{BT1}$.

In the embodiment of the adjustable driver stage 11 depicted in FIG. 1, the control manipulated variable $\Delta i_{BT1}$ is combined in the regulated final power control element 13 with the actuating signal supplied from the regulating controller 15 at the input of the final power control element 17. Such an arrangement is advantageous because the saturation level controller 25 operates in the small signal range and therefore does not need to be designed like a power transistor in order to transmit drive power. There is a separation between the driver stage 11 producing the actual drive power and the saturation level control 23 working parallel to it in the small signal range on a considerably lower energy level. An advantage of this separation is that the saturation level control 23 operates nearly independently from interactions and undesired feed back of the power circuitry of the power transistor T1. It is therefore possible for the device which controls the base current of the power transistor T1, comprising a coupling diode D2, a saturation level control 23 and a controlled driver stage 11, to work free from oscillations. A base current $I_{BT1}$ is free of harmonic oscillations can thus be provided to control the power transistor T1. Further, the control is adaptable to the electronic parameters of a particular power transistor T1 by making a corresponding adjustment to the saturation level controller 25.

There is an unrestricted adjustability of the desired level of saturation of the power transistor T1. A compromise choice can be made between the smallest possible switch-off losses, the smallest possible conduction losses, and the shortest possible storage time. This is accomplished by applying only the appropriate amount of base current that is needed to attain the desired level of saturation to the power transistor T1. In this manner, an unnecessary powering-up of the transistor T1 is avoided, especially when the load current $I_L$ becomes zero or negative. Thus, considerable savings are made in the amount of drive power needed. In addition, an undesirable inverse direction of operation is prevented.

The arrangement of the invention also has a very simple retrofit capability. Thus, because the control manipulated variable $\Delta i_{BT1}$ is in the small signal range at the output, the saturation level control 23 is easily coupled to a power transistor T1 that is already coupled to a controlled driver stage 11. This is advantageous in cases where the power transistor T1 and the driver stage 11 are already available as a compact unit.

In the embodiment of FIG. 1, the saturation level controller 25 is activated by the saturation level controller 25 itself when the power transistor T1 is in the on state and blocked by the saturation level controller 25 when the power transistor T1 is in the off state. For this purpose, the control signal ST of the control device 21 is supplied directly to the saturation level controller 25.

FIG. 2 shows in more detail a separate controller blocking device 29 that is used to supply the signal ST to the saturation level controller 25. The separate controller blocking device 29 is arranged between coupling diode D2 and the saturation level controller 25 and controlled by the signal ST at the output of the control device 21. This type of controller blocking device makes it possible to block the saturation level control 23 in other operating states as well, particularly when faults occur. Thus, when load currents $I_L$ are above a nominal value and produce a build-up in the voltage $V_{CET1}$, the power transistor T1 is increasingly desaturated. In such a case, the saturation level control would increase the base current $I_{BT1}$ in order to maintain the adjusted level of saturation of the power transistor T1. When there is an excess current, powering-up the base current in this manner must be avoided. This is done by blocking the saturation level control 23 with the separate controller blocking device 29.

In avoiding the undesirable inverse direction of operation in the power transistor T1, the present invention adjusts the saturation level controller 25 so that, irrespective of the polarity of the load current $I_L$, the control manipulated variable $\Delta i_{BT1}$ at the output of the $I_{BT1}$ at the base of the power transistor T1. This current $I_{BT1}$ is of such a magnitude that an inverse direction of operation is still prevented and, at the same time, the current-conducting condition is maintained in case the load current suddenly crosses over again into the positive direction.

A bridge branch of a pulse-controlled a.c. converter is depicted in FIG. 1. The bridge branch comprises the power transistor T1 and an antiparallel bypass diode $D_F$. In this bridge branch, a positive load current $I_L$ flows only through the power transistor T1, while negative load current $I_L$ flows only through the antiparallel bypass diode $D_F$. Thus, when there is a negative load current $I_L$, no current is distributed between the power transistor T1 and the bypass diode D1. Also, when there is a sudden change in the load current $I_L$ from the negative to the positive conducting direction, the power transistor T1 can immediately take over its current conducting function again. If the power transistor T1 in contrary is not prevented to be in the inverse direction of operation, there could arise sudden voltage jumps ("dv/dt-loading"), which could damage the power transistor. These sudden jumps are produced by the so-called blocking-recovery response of the bypass diode D1.

Other details of the embodiment of FIG. 1 are also illustrated in greater detail in FIG. 2. The self-regulating final power control element 13 in the controlled driver stage 11 contains a final power control element 17 that builds up a positive base current $I_{BT1}$. A base-current-limiting controller 31 is coupled to the final power control element 17. An auxiliary blocking device 33 provides a negative base current $I_{BT1}$, and a current-limiting controller 35 is coupled to this auxiliary blocking device 33.

The final power control element 17 produces a positive base current $I_{BT1}$ to switch on or maintain the conducting state of the power transistor T1. The final power control element 17 contains a regulating transistor T2 which is coupled via a resistor R1 to the positive potential VH of an auxiliary power supply 19. The base of this regulating transistor T2 is coupled to a ground reference point GND through a resistor R2. A first circuit component S1 is actuated by the control signal ST of the control instrument 21. The circuit component S1 is closed when a positive base current $I_{BT1}$ is needed to switch on or maintain the current-conducting circuit state of the power transistor T1. To limit this positive base current $I_{BT1}$, an additional base-current limiting, controller 31 acts on the final power control element 17. This comprises a constant-current source having a transistor T4 and an appropriate base resistor R5. To regulate the current, the Voltage drop across the resistor R1 is tapped off. To limit the base current $I_{BT1}$, the current from this constant current source is fed into the control input of the regulating transistor T2 in the final power control element 17.

An auxiliary blocking device 33 is used to produce a negative base current $I_{BT1}$ to switch off the power transistor T1. This device 33 contains a transistor T3, which is coupled to a negative auxiliary voltage $-V_H$ made available by the auxiliary power supply 19. The transistor T3 is coupled through a resistor R4 to the base of the power transistor T1. A resistor R3 is used to control the current to the base of the transistor T3. This base-collector resistor R3 is coupled through a bypass diode D1 and a second circuit component S2 to the positive potential $+V_H$ of the auxiliary power supply 19. When switching the power transistor T1 off, this circuit component S2 is closed which causes the negative current $I_{BT1}$ to flow to the base of the power transistor T1. To limit this negative current $I_{BT1}$, the current-limiting controller 35 acts upon the auxiliary blocking device 23. Also, this current-limiting controller 35 is a constant-current source comprising a transistor T5 with a base resistor R6. To control the constant current, the voltage drop across the emitter resistor R4 of the transistor T3 is controlled. The constant current is finally fed to the control input of the transistor T3.

According to the embodiment of FIG. 2, the saturation level controller 25 in the saturation level control 23 is a common emitter transistor T8 operating in the small signal range. The voltage $V_{CET1}$ across the output of the power transistor T1 is to the transistor T8 from the coupling diode D2 via a base resistor R9. The collector of the transistor T8 is coupled via a collector resistor R10 to the positive potential $+V_H$ of an auxiliary power supply 19. By selecting appropriate values for the resistors R9 and R10, the operating point and the gain can be adjusted. In other words, the total range of the auxiliary manipulated variable $\Delta i_{BT1}$ is a function of the electronic parameters of the particular power transistor T1. In the switched-on state, this power transistor T1 is operated with the desired level of saturation. In addition, when a load current $I_L$ is temporarily absent in the switched-on state, a closed-loop base current is produced with the exact magnitude necessary to prevent an inverse direction of operation from occurring.

According to the invention, the output control signal $V_R$ at the collector of transistor T8 is fed as an auxiliary manipulated variable $\Delta i_{BT1}$ through an uncoupling amplifier 27 to the control input final power control element 17. This uncoupling amplifier 27 is provided with a high input resistance and a low output resistance. This is achieved with a transistor T9, which has an emitter-resistor R11 and is operated as an impedance transformer. The auxiliary manipulated variable $\Delta_{iBT1}$, which is used as the output signal of the saturation level control 23, is thereby picked off at the emitter of the transistor T9.

The separate controller blocking device 29 is situated between the coupling diode D2 and the saturation level controller 25. According to the circuitry of FIG. 2, it comprises two series-connected switching transistors T6 and T7. These transistors are coupled respectively through a collector resistor R7 and R8 to the positive potential of the auxiliary power supply 19. The control signal ST from the control device 21 is applied to the control input of the first switching transistor T6. Finally, the junction point between the coupling diode D2 and the base resistor R9 of the transistor T8 in the saturation level controller 17 is also coupled to the collector of the second switching transistor T7.

What is claimed:
1. An arrangement for controlling base current of a power transistor having an output comprising:
   an adjustable driver stage having an output that is coupled to the base of the power transistor and which provides drive power to the power transistor at the driver stage output, and an adjusting input that receives an auxiliary manipulated variable that adjusts the amount of drive power provided;
   a coupling diode coupled to the output of the power transistor, which said coupling diode taps off at a first electrode the voltage at the output of the power transistor and provides said voltage as a system variable signal at a second electrode of said diode;
   a saturation level control having an input that is coupled to said second electrode of said coupling diode and an output coupled to the driver stage adjusting input, which said saturation level control receives the system variable signal at its input and provides said auxiliary manipulated variable at its output, whereby said driver stage is adjusted by said auxiliary manipulated variable such that said drive power operates the power transistor at a specified level of saturation.

2. The arrangement of claim 1, wherein the specified level of saturation is an edge of saturation.

3. The device of claim 1, further comprising a power supply voltage coupled to the saturation level control, and
   wherein said saturation level control includes a saturation level controller having a base resistor with one end coupled to the second electrode of said coupling diode, a common emitter transistor with a base, an emitter and a collector, said base coupled to the other end of said base resistor and said collector forming the output of the saturation level control, and a collector resistor coupled between the collector of the common emitter transistor and the power supply voltage, wherein the specified level of saturation depends on resistance values of the base and collector resistors.

4. The device of claim 3 further comprising:
a controller blocking device coupled between the saturation level control and the coupling diode which stops the operation of the saturation level control when a fault occurs.

5. The device of claim 4 wherein the fault is a load current in the power transistor that is too large.

6. The device of claim 4 wherein the fault is the switching off of the power transistor.

7. The arrangement of claim 4, further comprising an uncoupling amplifier with a high input resistance and low output resistance coupled between the output of the saturation level control and the input of the driver stage.

8. The arrangement of claim 7 further comprising means for producing a closed loop base current in the switched on state of the power transistor of such a magnitude that an inverse direction of operation is prevented in the power transistor when the load current is negative and a current conducting condition is maintained when the load current crosses over into a positive direction.

* * * * *